(12) United States Patent
Chen et al.

(10) Patent No.: US 8,268,655 B2
(45) Date of Patent: Sep. 18, 2012

(54) METHOD FOR FABRICATING FLEXIBLE DISPLAY DEVICE

(75) Inventors: Lee-Tyng Chen, Hsinchu (TW);
Po-Wen Hsiao, Hsinchu (TW);
Kai-Cheng Chuang, Hsinchu (TW);
Ted-Hong Shinn, Hsinchu (TW)

(73) Assignee: E Ink Holdings Inc., Hsinchu County (TW)

( * ) Notice: Subject to any disclaimer, the term of this patent is extended or adjusted under 35 U.S.C. 154(b) by 387 days.

(21) Appl. No.: 12/556,692

(22) Filed: Sep. 10, 2009

(65) Prior Publication Data
US 2011/0008921 A1    Jan. 13, 2011

(30) Foreign Application Priority Data
Jul. 8, 2009 (TW) .............................. 98123118 A

(51) Int. Cl.
*H01L 21/00* (2006.01)
(52) U.S. Cl. .................................. 438/30; 257/E33.068
(58) Field of Classification Search .................... 438/30; 257/E33.068
See application file for complete search history.

(56) References Cited

U.S. PATENT DOCUMENTS
2002/0006248 A1* 1/2002 Makino et al. ................. 385/18
2007/0091062 A1* 4/2007 French et al. ................. 345/107
* cited by examiner

*Primary Examiner* — Lex Malsawma
(74) *Attorney, Agent, or Firm* — Chun-Ming Shih

(57) ABSTRACT

A method for fabricating flexible display device includes the following steps. Firstly, a rigid substrate is provided. Secondly, a sacrificing layer is formed on the rigid substrate. Thirdly, an element layer is formed on the sacrificing layer. Fourthly, the sacrificing layer is etched by a gas and then gasified, so that the element layer is separated from the rigid substrate. Then, the element layer is adhered to a flexible substrate. Because products generated by the sacrificing layer reacting with the gas are gases, the products can be removed by air exhaust for simplifying process. Thus, the cost of the process of fabricating flexible display device can be decreased.

14 Claims, 8 Drawing Sheets

METHOD FOR FABRICATING FLEXIBLE DISPLAY DEVICE

BACKGROUND

This application claims priority to a Taiwan application No. 098123118 filed Jul. 8, 2009.

FIELD OF THE INVENTION

The invention relates to a method for fabricating display device, and more particularly, to a method for fabricating flexible display device.

DESCRIPTION OF THE RELATED ART

With progress of science and technology, display devices are used in any electric products popularly. Moreover, since the development trend of the portable electrical product is to achieve light weight and thin thickness, the flexible display device are researched.

During the manufacturing process of the flexible display device, since the plastic substrate has the defects of low glass transition temperature ($T_g$) and large coefficient of expansion and the process tool cannot carry the plastic substrate, the internal elements of the flexible display device could not immediately formed on the plastic substrate. Therefore, the elements are usually formed on a glass substrate first during the conventional manufacturing process of the flexible display device, and then the elements are separated from the glass substrate to adhere to the plastic substrate.

However, the conventional method for separating the elements from the glass substrate is performed by illuminating laser. During the process, the glass has been demanded of high cleanness and the laser has been demanded of high precise control. In other words, the manufacturing process of the flexible display device is complicated.

Accordingly, how to improve and facilitate the manufacturing process of the flexible display device for reducing the cost thereof is an important issue considered by the one skilled in the art.

BRIEF SUMMARY

The invention is directed to a method for fabricating flexible display device with low cost.

The invention provides a method for fabricating flexible display device. Firstly, a rigid substrate is provided. Secondly, a sacrificing layer is formed on the rigid substrate. Thirdly, an element layer is formed on the sacrificing layer. Fourthly, the sacrificing layer is etched by a gas and then gasified, so that the element layer is separated from the rigid substrate. Then, the element layer is adhered to a flexible substrate.

In the method for fabricating the flexible display device of the invention, because products generated by the sacrificing layer reacting with the gas are gases, the products can be removed by air exhaust without using any laser equipments. In other words, the present invention not only easily meets the required cleanness condition of the rigid substrate in the fabricating process but also simplifies the process to decrease the cost of fabricating flexible display device.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1A:
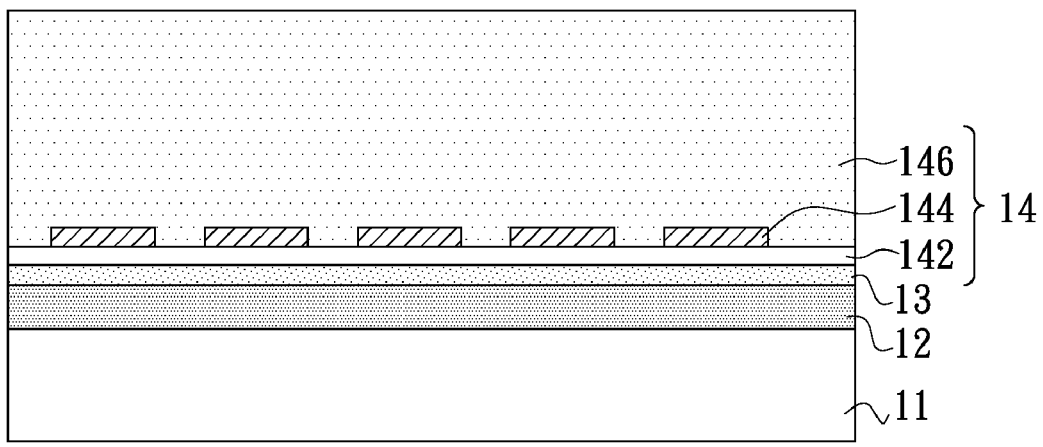
FIG. 1A to FIG. 1C are schematic cross-section views of the flexible display device during manufacturing process according to the first embodiment of the invention.
Figure 1B:
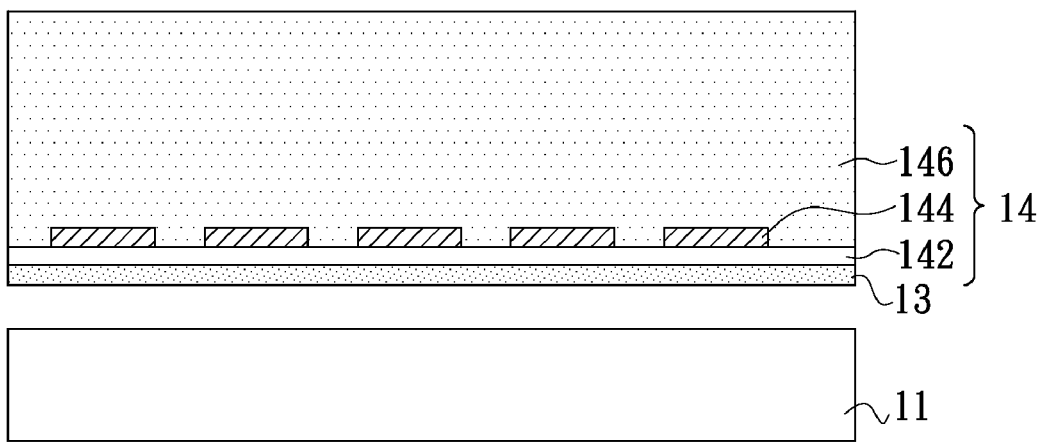
Figure 1C:
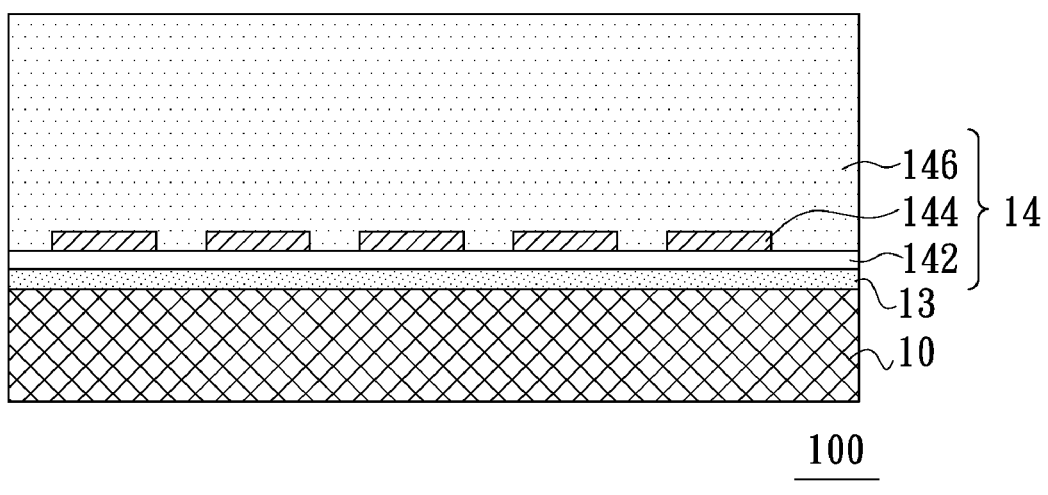

FIG. 1A to FIG. 1C are schematic cross-section views of the flexible display device during manufacturing process according to the first embodiment of the invention. Referring to FIG. 1A, the method for fabricating flexible display device of the present embodiment includes the following steps. Firstly, a rigid substrate 11 is provided. Secondly, a sacrificing layer 12 is formed on the rigid substrate 11. Thirdly, an element layer 14 is formed on the sacrificing layer 12. The rigid substrate 11 is made of glass and the sacrificing layer 12 is, for example, made of molybdenum (Mo), titanium (Ti), tungsten (W) or amorphous silicon.

In detail, the method of forming the element layer 14 includes the following steps. Firstly, an insulating layer 142 is formed on the sacrificing layer 12. Secondly, a thin film transistors array 144 is formed on the insulating layer 142. Thirdly, a display medium layer 146 is formed on the thin film transistors array 144. The insulating layer 142 is made of oxide or nitride. The display medium layer 146 may be microcapsule electrophoretic layer, microcup electrophoretic layer, liquid crystal layer, electro-wetting layer or quick response-liquid powder layer.

Particularly, a supporting layer 13 may be formed on the sacrificing layer 12 before forming the element layer 14. After that, the element layer 14 is formed on the supporting layer 13.

Referring FIG. 1A and FIG. 1B, the sacrificing layer 12 is etched by a gas and then gasified, so that the element layer 14 is separated from the rigid substrate 11. The gas is, for example, xenon fluoride gas. For example, the sacrificing layer 12 is made of molybdenum (Mo) or amorphous silicon, the xenon fluoride gas will react with the sacrificing layer 12 as the following formulae of the chemical reaction:

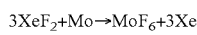

$$3XeF_2 + Mo \rightarrow MoF_6 + 3Xe$$

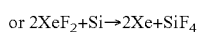

$$or\ 2XeF_2 + Si \rightarrow 2Xe + SiF_4$$

According to the above formulae of the chemical reaction, products generated by the sacrificing layer 12 reacting with the gas are gases. Therefore, the gases can be removed by air exhaust during the process of etching the sacrificing layer 12.

It should be noted that after the element layer 14 being separated from the rigid substrate 11, the rigidity of the supporting layer 13 is provided for preventing the element layer 14 from damaging during the follow-up process thereof after separating from the rigid substrate 11.

Referring FIG. 1C, the element layer 14 is adhered to a flexible substrate 10. The fabrication of the flexible display device 100 of the present invention is substantially finished. Specifically, the supporting layer 13 and the element layer 14 formed thereon are adhered to a flexible substrate 10 in this embodiment. The flexible substrate 10 is, for example, made of polyimide, polyethylene terephthalate, polyethylene naphthalene, aromatic polyamide, polycycloolefin, polysulfone, epoxy resin, polycarbonate or polymethyl methacrylate.

Figure 2:
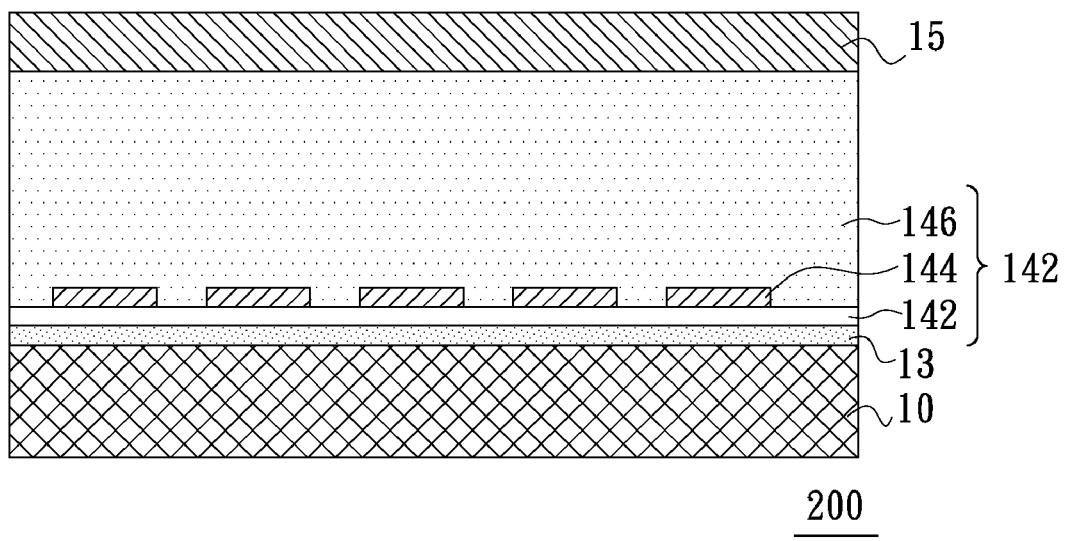
FIG. 2 is a schematic partial cross-section view of the flexible display device according to the second embodiment of the invention.

Specially, as shown in FIG. 2, a desired color flexible display device 200 can be accomplished by the following steps. A color filter 15 is assembled on the flexible substrate 10 after the element layer 14 being adhered to the flexible substrate 10 so as to make the element layer 14 between the color filter 15 and the flexible substrate 10. The color filter 15 is also flexible.

Accordingly, the element layer 14 can be separated from the rigid substrate 11 without using any laser equipments, the invention is facilitated to meet the required cleanness condition of the rigid substrate 11 and the process is simplified. Furthermore, the equipments used for etching the sacrificing layer 12 are simpler and cheaper than the conventional laser equipments.

In addition, it is to be understood that the flexible display device 100 accomplished by the fabricating method of the present embodiment can be microcapsule electrophoretic display, microcup electrophoretic display, cholesteric liquid crystal display, electro-wetting display or quick response-liquid powder display determined by the type of the display medium layer 146.

Figure 3A:
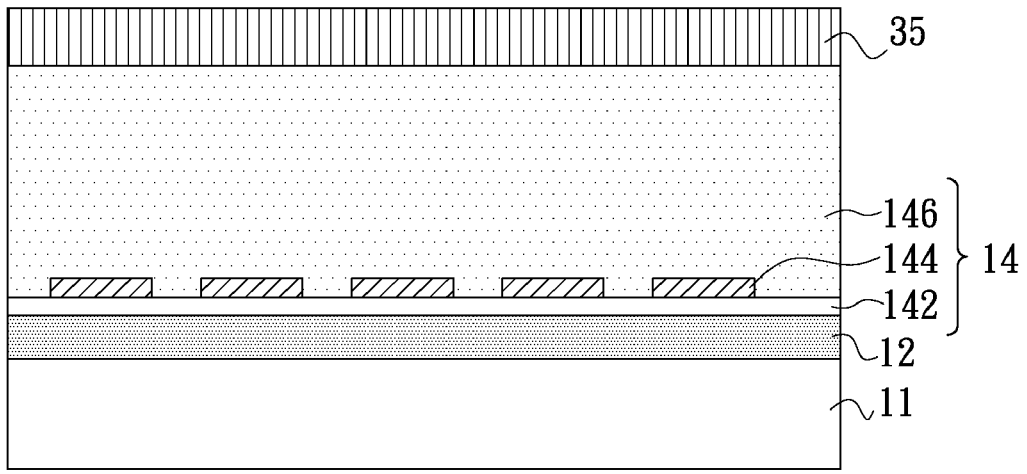
FIG. 3A to FIG. 3D are schematic cross-section views of the flexible display device during manufacturing process according to the third embodiment of the invention.

FIG. 3A to FIG. 3D are schematic cross-section views of the flexible display device during manufacturing process according to the third embodiment of the invention. Referring to FIG. 3A, the method for fabricating the flexible display device in the third embodiment is similar to the one in the first embodiment. The difference between them is described as following.

Figure 3B:
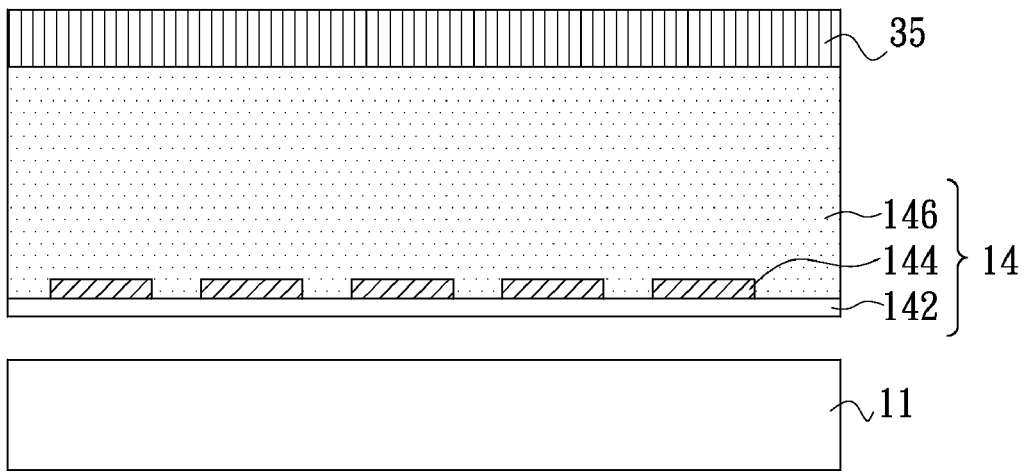

Referring to FIG. 3A and FIG. 3B, after forming the element layer 14 on the sacrificing layer 12, a temporarily fixing layer 35 is formed on the display medium layer 146 of the element layer 14 and then the sacrificing layer 12 is etched by the method as above mentioned, so that the element layer 14 is separated from the rigid substrate 11. Specifically, the temporarily fixing layer 35 is, for example, glue or substrate which are easily to be peeled off to provide enough supporting rigidity for the element layer 14 to prevent the element layer 14 from damaging during the follow-up process thereof after the element layer 14 being separated from the rigid substrate 11.

Figure 3C:
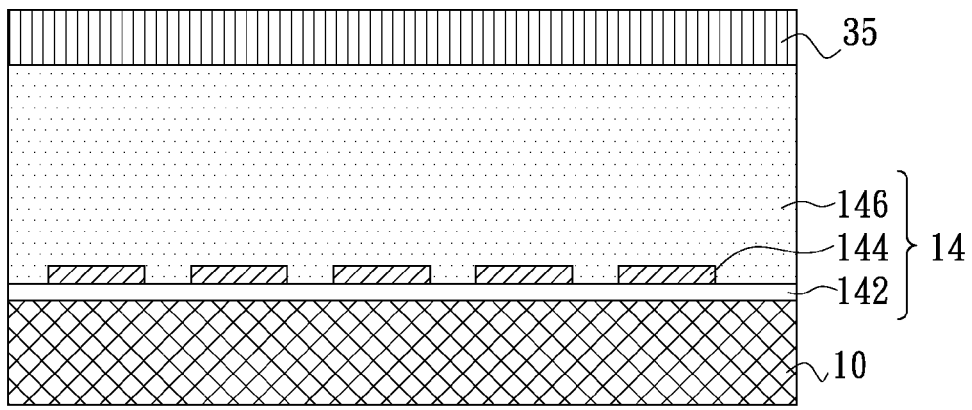
Figure 3D:
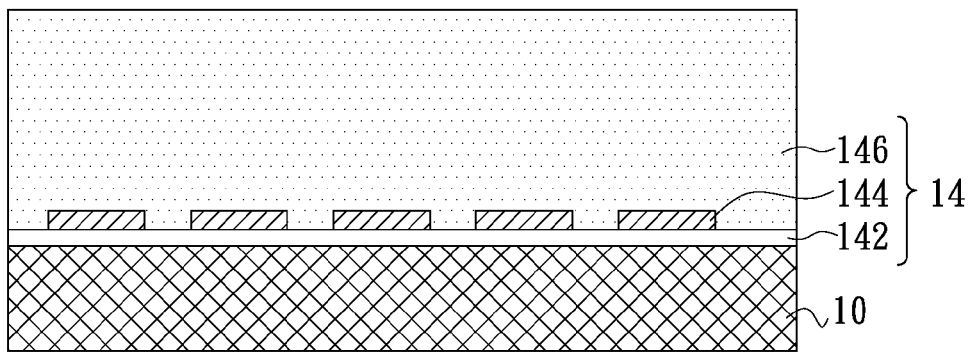
Figure 4:
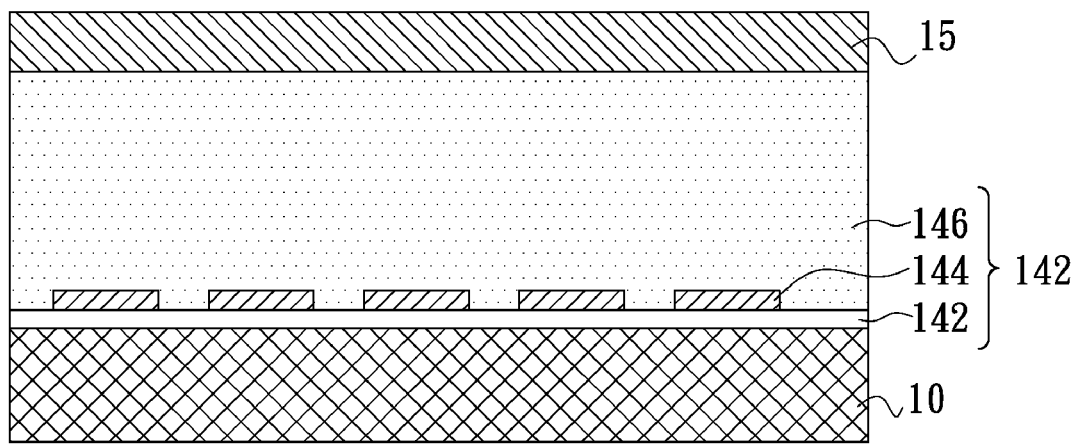
FIG. 4 is a schematic partial cross-section view of the flexible display device according to the fourth embodiment of the invention.

Referring to FIG. 3C, the element layer 14 is adhered to the flexible substrate 10. The enough rigidity is provided for the element layer 14 by the flexible substrate 10, and therefore the temporarily fixing layer 35 can be removed from the element layer 14, as shown in FIG. 3D. Further, after removing the temporarily fixing layer 35, the color filter 15 can be assembled above the flexible substrate 10, as shown in FIG. 4, so as to make the flexible display device 300 display color image.

The element layer 14 including the thin film transistors array 144 is adhered to the flexible substrate 10 and then the flexible color filter 15 is assembled above the flexible substrate 10 in the aforementioned embodiments, but it is not limited hereto. In other embodiments, the method for fabricating flexible display device of the present invention may include the following steps. The element layer including the color filter array is adhered to the flexible substrate, and then the flexible substrate is assembled above a thin film transistors array substrate. This will be discussed with reference to the following embodiment.

Figure 5A:
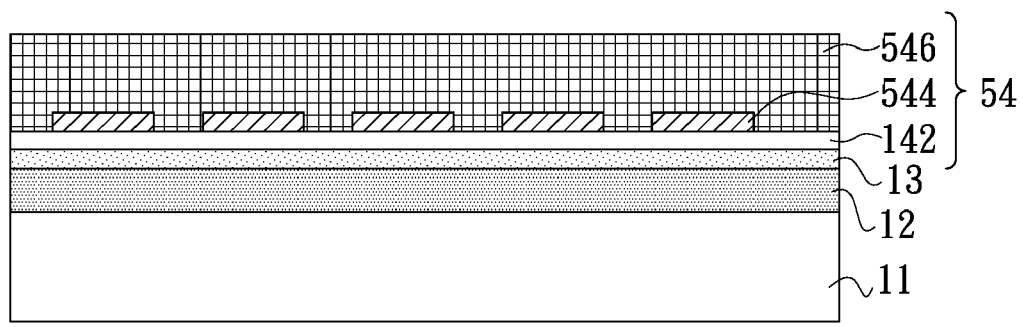
FIG. 5A to FIG. 5D are schematic cross-section views of the flexible display device during manufacturing process according to the fifth embodiment.

FIG. 5A to FIG. 5D are schematic cross-section views of the flexible display device during manufacturing process according to the fifth embodiment. Referring to FIG. 5A, the method for fabricating flexible display device of the present embodiment includes the following steps. Firstly, a rigid substrate 11 is provided. Secondly, a sacrificing layer 12 is formed on the rigid substrate 11. Thirdly, an element layer 54 is formed on the sacrificing layer 12. In detail, the method of forming the element layer 54 includes the following steps. Firstly, an insulating layer 142 is formed on the sacrificing layer 12. Secondly, a color filter array 544 is formed on the insulating layer 142. Furthermore, the passivation layer 546 is formed on the color filter array 544 to protect the color filter array 544. Since the passivation layer 546 usually is flat film layer, the passivation layer 546 not only protects the color filter array 544 but also enhances the overall planarity of the element layer 54.

Figure 5B:
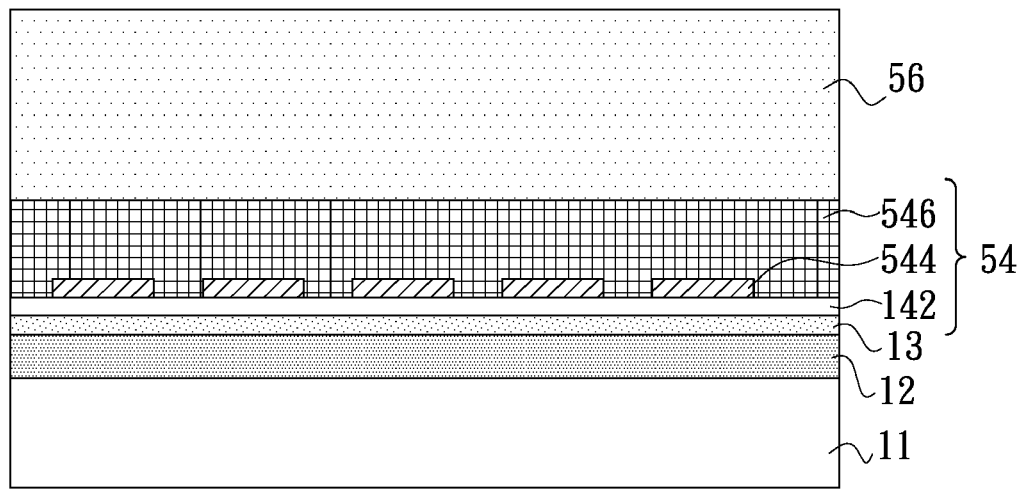

Referring to FIG. 5B, more particularly, a display medium layer 56 is formed on the element layer 54 after forming the element layer 54. The display medium layer 56 is similar to or the same with the display medium layer 146 in the aforementioned embodiments, it is unnecessary to say here.

Figure 5C:
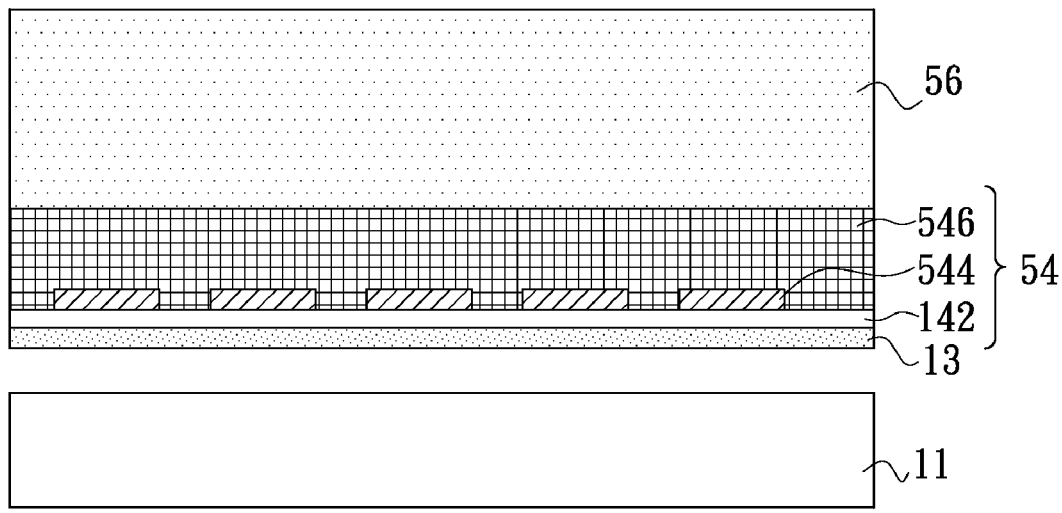

Referring to FIG. 5B and FIG. 5C, the sacrificing layer 12 is etched by a gas and then gasified, so that the element layer 54 is separated from the rigid substrate 11. As mentioned above, because products generated by the sacrificing layer reacting with the gas are gases, the products can be removed by air exhaust.

Figure 5D:
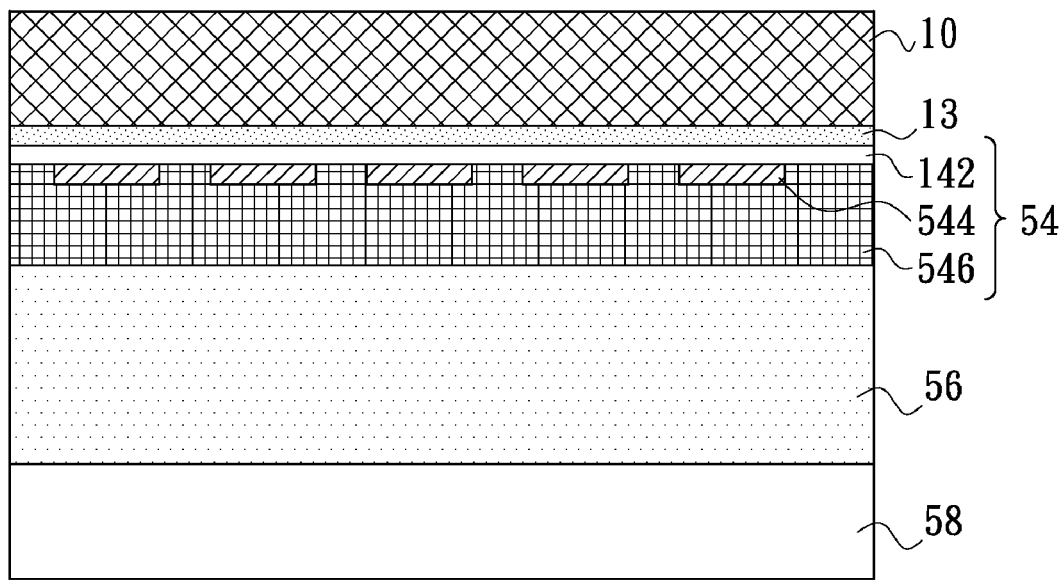

Referring to FIG. 5D, the flexible substrate 10 is assembled above the thin film transistors array substrate 58 after the element layer 54 being adhered to the flexible substrate 10, and thus the flexible display device 500 is formed. The thin film transistors array substrate 58 is also flexible.

In summary, in the method for fabricating flexible display device of the present invention, because products generated by the sacrificing layer reacting with the gas are gases, the products can be removed by air exhaust. Hence, compared to the conventional process of separating the element from the rigid substrate by laser, the method of the present invention not only simplifies the process but also easily meet the required cleanness condition of the rigid substrate to decrease the cost of fabricating flexible display device.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:
1. A method for fabricating flexible display device, comprising the steps of:
   providing a rigid substrate;
   forming a sacrificing layer on the rigid substrate;
   forming an element layer directly contacting with and on the sacrificing layer;
   forming a temporarily fixing layer directly contacting with and on the element layer;
   etching the sacrificing layer by a gas thus the sacrificing layer is gasified for separating element layer from the rigid substrate; and
   adhering the element layer to a flexible substrate.

2. The method as claimed in claim 1, wherein the sacrificing layer is made of molybdenum (Mo), titanium (Ti), tungsten (W) or amorphous silicon.

3. The method as claimed in claim 1, wherein the gas is xenon fluoride gas.

4. The method as claimed in claim 1, wherein the method for forming the element layer comprises the steps of:
   forming an insulating layer on the sacrificing layer;
   forming a thin film transistors array on the insulating layer; and
   forming a display medium layer on the thin film transistors array.

5. The method as claimed in claim 4, wherein the insulating layer is made of oxide or nitride.

6. The method as claimed in claim 4, wherein the display medium layer comprises microcapsule electrophoretic layer, microcup electrophoretic layer, liquid crystal layer, electrowetting layer or quick response-liquid powder layer.

7. The method as claimed in claim 1, further comprising the step of removing the temporarily fixing layer after the element layer being adhered to the flexible substrate.

8. The method as claimed in claim 4, further comprising the step of assembling a color filter above the flexible substrate so as to make the element layer between the color filter and the flexible substrate.

9. The method as claimed in claim 1, wherein the method for forming the element layer comprises the steps of:
   forming an insulating layer on the sacrificing layer; and
   forming a color filter array on the sacrificing layer.

10. The method as claimed in claim 9, further comprising the step of forming a passivation layer on the color filter array.

11. The method as claimed in claim 9, further comprising the step of forming a display medium layer on the color filter array.

12. The method as claimed in claim 9, further comprising the step of assembling the flexible substrate above a thin film transistors array substrate so as to make the element layer between the thin film transistors array substrate and the flexible substrate.

13. The method as claimed in claim 1, wherein the rigid substrate is made of glass.

14. The method as claimed in claim 1, wherein the flexible substrate is made of polyimide, polyethylene terephthalate, polyethylene naphthalene, aromatic polyamide, polycycloolefin, polysulfone, epoxy resin, polycarbonate or polymethyl methacrylate.

* * * * *